United States Patent
Sung et al.

(10) Patent No.: US 7,801,259 B2
(45) Date of Patent: Sep. 21, 2010

(54) FREQUENCY DETECTING CIRCUIT AND METHOD, AND SEMICONDUCTOR APPARATUS INCLUDING FREQUENCY DETECTING CIRCUIT

(75) Inventors: Hyuk-Jun Sung, Yongin-si (KR); Ki-Bum Nam, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 964 days.

(21) Appl. No.: 11/507,771

(22) Filed: Aug. 22, 2006

(65) Prior Publication Data
US 2007/0047688 A1   Mar. 1, 2007

(30) Foreign Application Priority Data
Aug. 26, 2005   (KR) .................. 10-2005-0078977

(51) Int. Cl.
*H04L 7/04* (2006.01)
(52) U.S. Cl. .................. 375/362; 375/316; 375/326; 375/354
(58) Field of Classification Search .................. 375/362, 375/316, 326, 354
See application file for complete search history.

(56) References Cited

U.S. PATENT DOCUMENTS

| | | | |
|---|---|---|---|
| 5,307,028 A | 4/1994 | Chen | |
| 6,059,191 A * | 5/2000 | Sedlak et al. | 235/492 |
| 6,259,755 B1 * | 7/2001 | O'Sullivan et al. | 375/376 |
| 7,151,727 B2 * | 12/2006 | Iimura et al. | 369/47.22 |

FOREIGN PATENT DOCUMENTS

| | | |
|---|---|---|
| EP | 1434057 A2 | 6/2004 |
| KR | 259590 | 6/2000 |
| KR | 00275134 B1 | 9/2000 |
| KR | 1020010055878 A | 7/2001 |

* cited by examiner

*Primary Examiner*—Ted M Wang
(74) *Attorney, Agent, or Firm*—F. Chau & Associates, LLC

(57) ABSTRACT

A frequency detecting circuit and method and a semiconductor apparatus including the frequency detecting circuit, in which the frequency detecting circuit includes an edge detecting circuit, a clock signal generating circuit, and a determination circuit. The edge detecting circuit detects an edge of an input clock signal. The clock signal generating circuit generates a selection clock signal, which is a periodic pulse signal, in response to the detected edge. The determination circuit generates a frequency detection signal based on the number of occurrences of the selection clock signal in a period of the clock signal. The semiconductor apparatus includes the above-described frequency detecting circuit and a processor resetting the semiconductor apparatus in response to the frequency detection signal. Since a frequency is detected every half period, that is every high/low level period, of the clock signal in a digital manner, the reliability and the accuracy of frequency detection is improved.

25 Claims, 15 Drawing Sheets

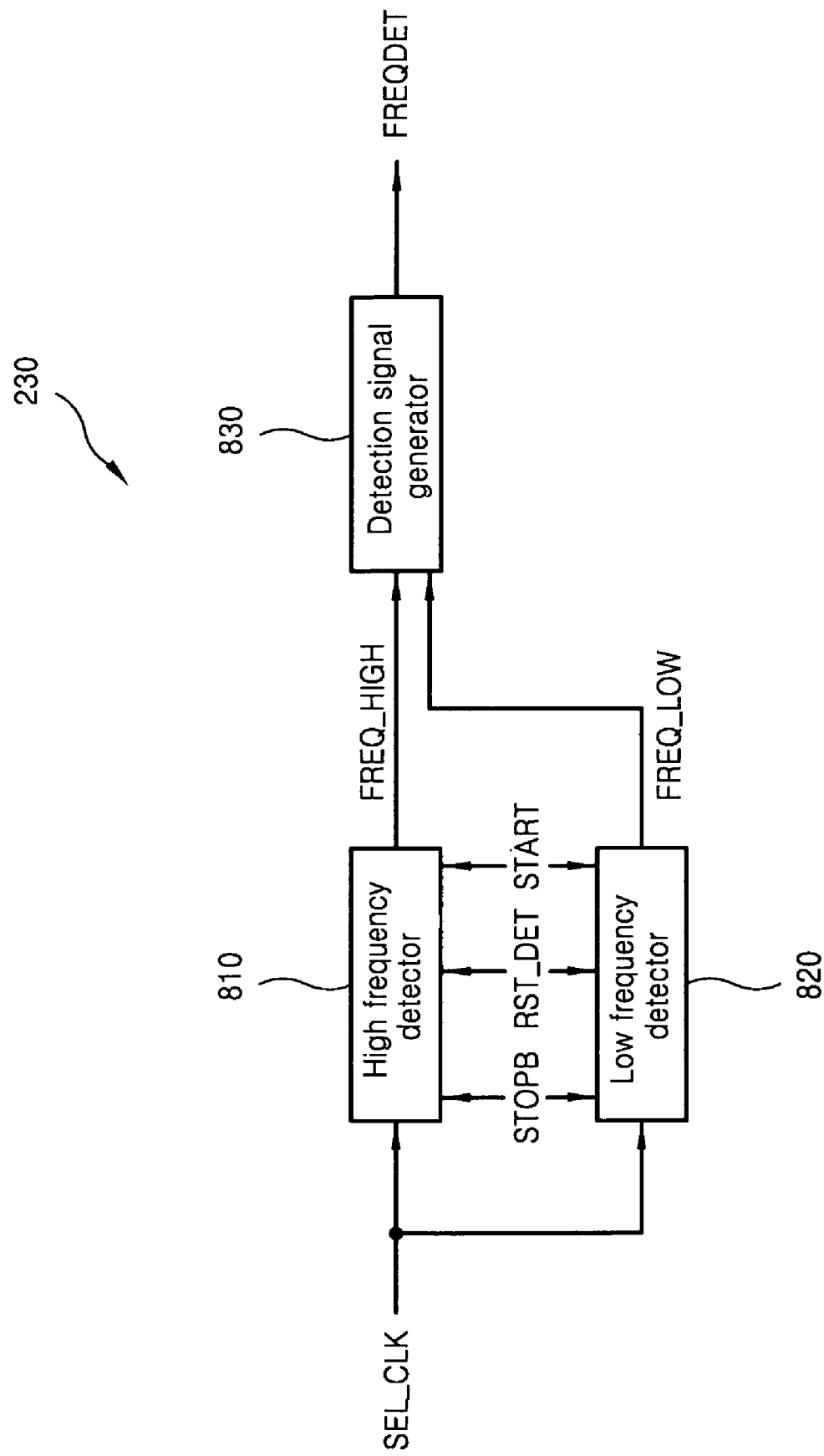

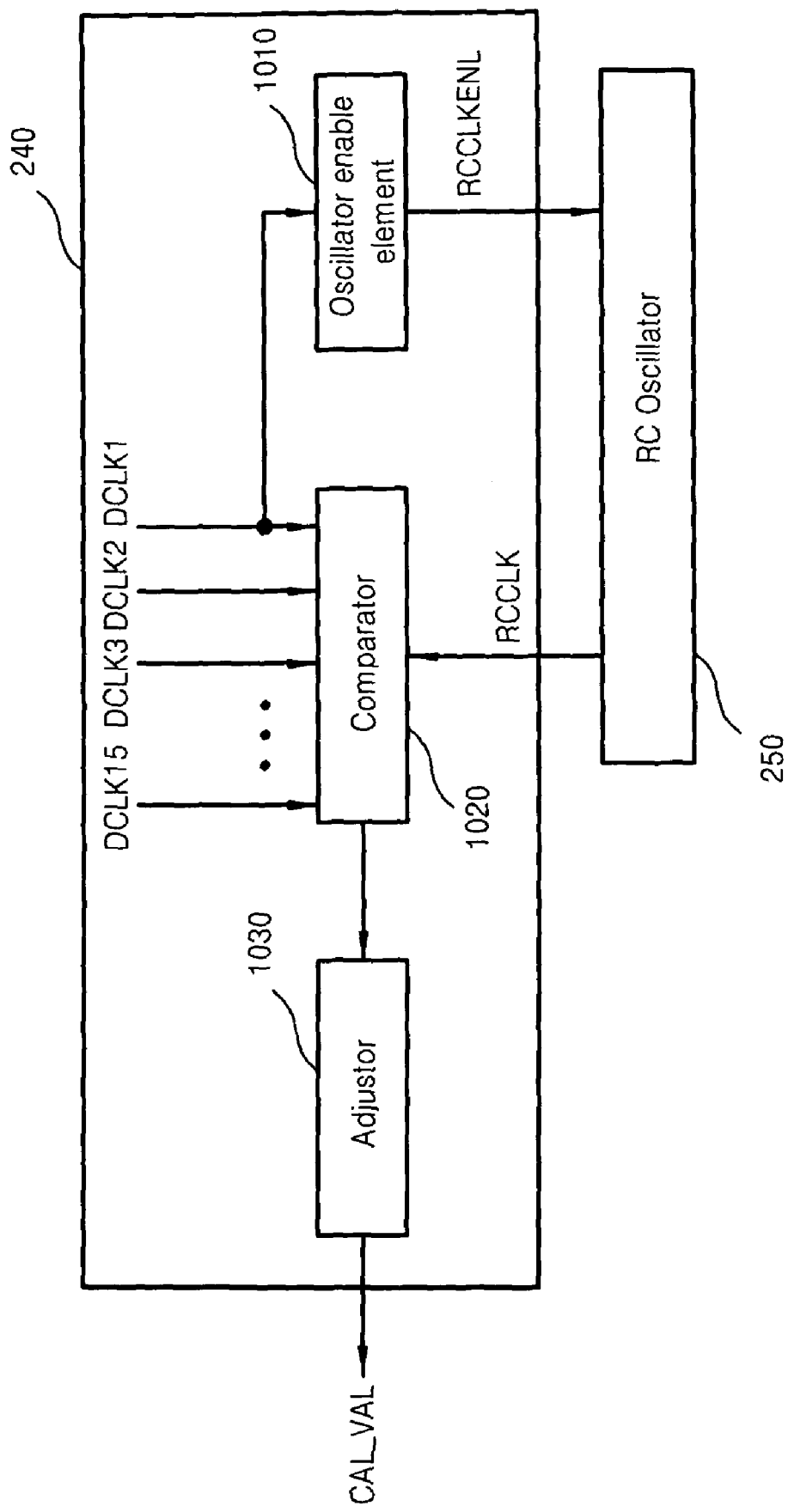

FREQUENCY DETECTING CIRCUIT AND METHOD, AND SEMICONDUCTOR APPARATUS INCLUDING FREQUENCY DETECTING CIRCUIT

CROSS-REFERENCE TO RELATED PATENT APPLICATION

This application claims priority of Korean Patent Application No. 10-2005-0078977, filed on Aug. 26, 2005, in the Korean Intellectual Property Office, the disclosure of which is incorporated herein in its entirety by reference.

BACKGROUND OF THE INVENTION

1. Technical Field

The present disclosure relates to a frequency detecting circuit and, more particularly, to a frequency detecting circuit that operates using a digital control method, and a semiconductor apparatus including the same.

2. Discussion of the Related Art

To ensure circuit stability, integrated circuit cards such as smart cards need to operate only in a predetermined frequency range and to be entirely reset in a frequency range in which an error may occur in an internal circuit. For this operation, some semiconductor apparatuses, such as smart cards, include a frequency detecting circuit. The frequency detecting circuit detects a frequency of a clock signal input to a semiconductor apparatus and determines whether the frequency is in a normal range.

FIG. 1 is a schematic block diagram of a conventional frequency detecting circuit. The conventional frequency detecting circuit includes a pulse shaping circuit 110, a first filter 120, a second filter 130, and a detection signal generator 140.

The pulse shaping circuit 110 changes or divides the waveform of an input clock signal XCLK. The first and second filters 120 and 130 are low-pass filters (LPFs) and have a first cutoff frequency and a second cutoff frequency, respectively, where the first cutoff frequency is greater than the second cutoff frequency. Conventionally, the first and second filters 120 and 130 are implemented using an analog resistor-capacitor (RC) filter.

Table 1 below shows an ideal operation of the frequency detecting circuit illustrated in FIG. 1. Here, it is assumed that the first and second cutoff frequencies are 7.5 MHz and 500 kHz, respectively.

TABLE 1

| Operating frequency | HIGH_OUT | HIGH_LOW | FREQ_DET |
| --- | --- | --- | --- |
| Lower than second cutoff frequency (0~500 kHz) | Clock signal | Clock signal | LOW |
| Between first and second cutoff frequencies (500 kHz~7.5 MHz) | Clock signal | 0 | HIGH |
| Higher than first cutoff frequency (7.5 MHz~) | 0 | 0 | LOW |

Referring to Table 1, when an input frequency is abnormally low, that is, when the input frequency is lower than the second cutoff frequency (0~500 kHz), output signals HIGH_OUT and HIGH_LOW of the first and second filters 120 and 130 are clock signals toggling between a high level and a low level. When the input frequency is in a normal range, that is, when the input frequency is in a range between the first and second cutoff frequencies (500 kHz~7.5 MHz), the output signal HIGH_OUT of the first filter 120 is a clock signal and the output signal HIGH_LOW of the second filter 130 is close to "0". When the input frequency is abnormally high, that is, when the input frequency is higher than the first cutoff frequency (7.5 MHz~), the output signals HIGH_OUT and HIGH_LOW of the first and second filters 120 and 130 are both close to "0".

The detection signal generator 140 generates a detection signal FREQ_DET at the high level only when the output signal HIGH_OUT of the first filter 120 is the clock signal and the output signal HIGH_LOW of the second filter 130 is "0", thereby indicating that the input frequency is in the normal range.

When an analog method using an analog RC filter is used for frequency detection, a large chip area is needed and a large amount of power is consumed. In addition, when the clock signal XCLK does not have a duty cycle of 50%, that is, when a high level period is short and a low level period is long or when a low level period is short and a high level period is long, the frequency cannot be detected using the analog method. As a result, a semiconductor device such as memory, which needs to operate normally in both of the high level period and the low level period of the clock signal XCLK, may operate erroneously.

Particularly, in an application such as a smart card in which a data value in the memory is very important, a high reliability of the frequency detecting circuit is required. Accordingly, a frequency detecting circuit for accurately detecting a frequency even when a clock signal whose duty cycle is not 50% is input and for limiting power consumption and decreasing a chip area is desired.

SUMMARY OF THE INVENTION

Exemplary embodiments of the present invention provide a digital type frequency detecting circuit and method for increasing accuracy and reliability of frequency detection by detecting a frequency at intervals of a half period, that is, once in every high/low level period, of a clock signal, and a semiconductor apparatus including the frequency detecting circuit.

According to an exemplary embodiment of the present invention, there is provided a frequency detecting circuit including an edge detecting circuit, a clock signal generating circuit, and a determination circuit.

The edge detecting circuit detects an edge of a clock signal and generates an edge detection signal. The clock signal generating circuit generates a selection clock signal in response to the edge detection signal. The clock signal generating circuit may generate the selection clock signal at least one time during the period of the clock signal when the frequency of the clock signal is in a predetermined normal range. The determination circuit determines whether a frequency of the clock signal is in the predetermined normal range based on the number of occurrences of the selection clock signal during a period, that is, a period between adjacent edges, of the clock signal.

The determination circuit may generate a frequency detection signal at a first logic level when the number of occurrences of the selection clock signal is greater than or equal to a first reference value and less than a second reference value and may generate the frequency detection signal at a second logic level when the number of occurrences of the selection clock signal is less than the first reference value or is greater than or equal to the second reference value.

According to an exemplary embodiment of the present invention, there is provided a frequency detecting circuit including an edge detecting circuit, a clock signal generating circuit, and a determination circuit. The edge detecting circuit detects an edge of a clock signal. The clock signal generating circuit generates a selection clock signal in response to the detected edge. The determination circuit detects a frequency of the clock signal based on the number of occurrences of the selection clock signal in a period of the clock signal.

The clock signal generating circuit may include a plurality of digital delay units connected in series, and a selector selecting one signal from among output signals of the plurality of digital delay units in response to a selection signal and outputting the selected signal as a delayed clock signal.

The frequency detecting circuit may further include a control circuit comparing a single cycle of an oscillator clock signal with each of the output signals of the plurality of digital delayers and setting the selection signal.

According to an exemplary embodiment of the present invention, there is provided a semiconductor apparatus including a frequency detecting circuit and a processor. The frequency detecting circuit detects a frequency of a clock signal and generates a frequency detection signal. The frequency detecting circuit includes an edge detecting circuit, a clock signal generating circuit, and a determination circuit. The edge detecting circuit detects an edge of the clock signal. The clock signal generating circuit generates a selection clock signal in response to the detected edge. The determination circuit generates the frequency detection signal based on the number of occurrences of the selection clock signal in a period of the clock signal. The processor is reset in response to the frequency detection signal, According to an exemplary embodiment of the present invention, there is provided a method of detecting a frequency. The method includes detecting an edge of a clock signal, generating a selection clock signal in response to the detected edge, and detecting a frequency of the clock signal based on the number of occurrences of the selection clock signal during a period between adjacent edges of the clock signal.

BRIEF DESCRIPTION OF THE DRAWINGS

Exemplary embodiments of the present invention will be understood in more detail from the following descriptions taken in conjunction with the attached drawings in which:

FIG. 8 is a block diagram of a determination circuit illustrated in FIG. 2;

FIG. 10 is a block diagram of a control circuit illustrated in FIG. 2;

DETAILED DESCRIPTION OF EXEMPLARY EMBODIMENTS

Figure 1:
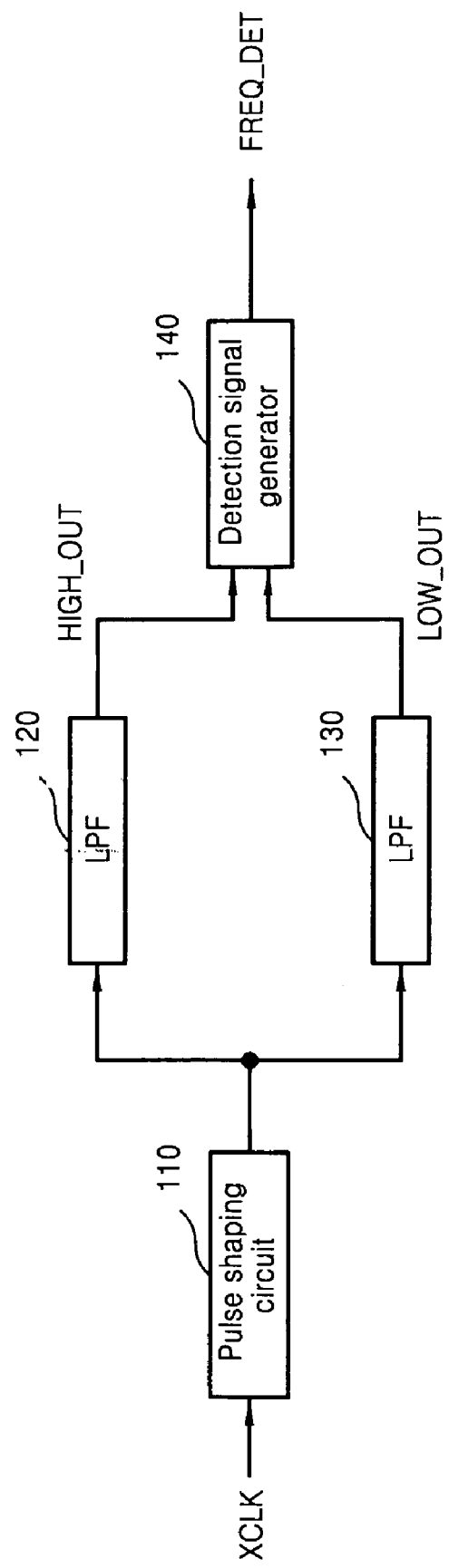
FIG. 1 is a schematic block diagram of a conventional frequency detecting circuit.

Hereinafter, the present invention will be described in detail by explaining exemplary embodiments of the present invention with reference to the attached drawings. Like reference numerals in the drawings denote like elements.

Figure 2:
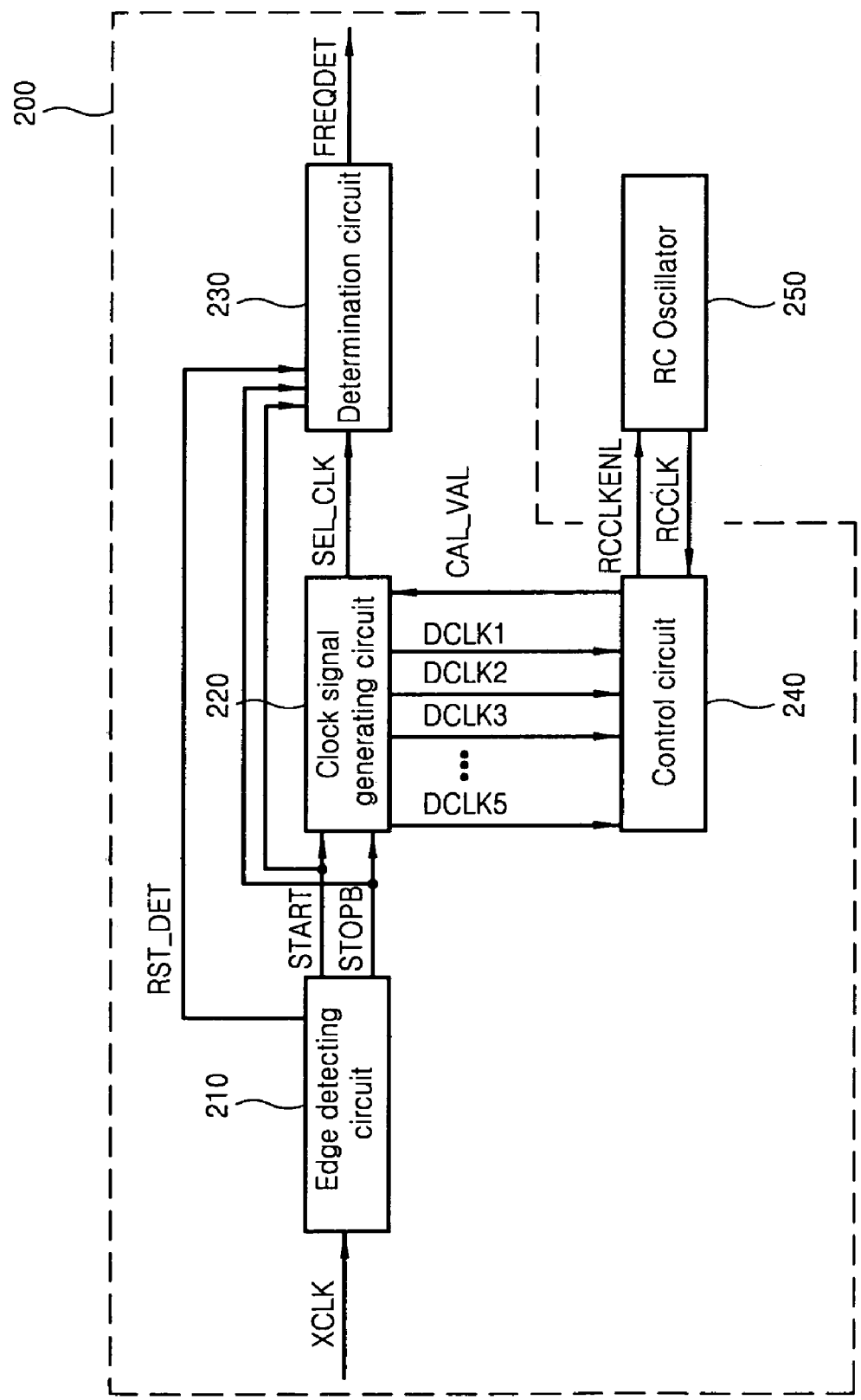
FIG. 2 is a block diagram of a frequency detecting circuit according to an exemplary embodiment of the present invention.

FIG. 2 is a block diagram of a frequency detecting circuit 200 according to an exemplary embodiment of the present invention. The frequency detecting circuit 200 includes an edge detecting circuit 210, a clock signal generating circuit 220, a determination circuit 230, and a control circuit 240. The frequency detecting circuit 200 detects a frequency of an input clock signal XCLK by accurately detecting every period between adjacent edges of the clock signal XCLK, that is, every first logic level, for example, every high level period and every second logic level for example, every low level period.

The edge detecting circuit 210 detects a rising edge and a falling edge of the clock signal XCLK and generates edge detection signals START and STOPB synchronized with the detected edges. The rising edge corresponds to the transition from the low level to the high level, and the falling edge corresponds to the transition from the high level to the low level.

Figure 3:
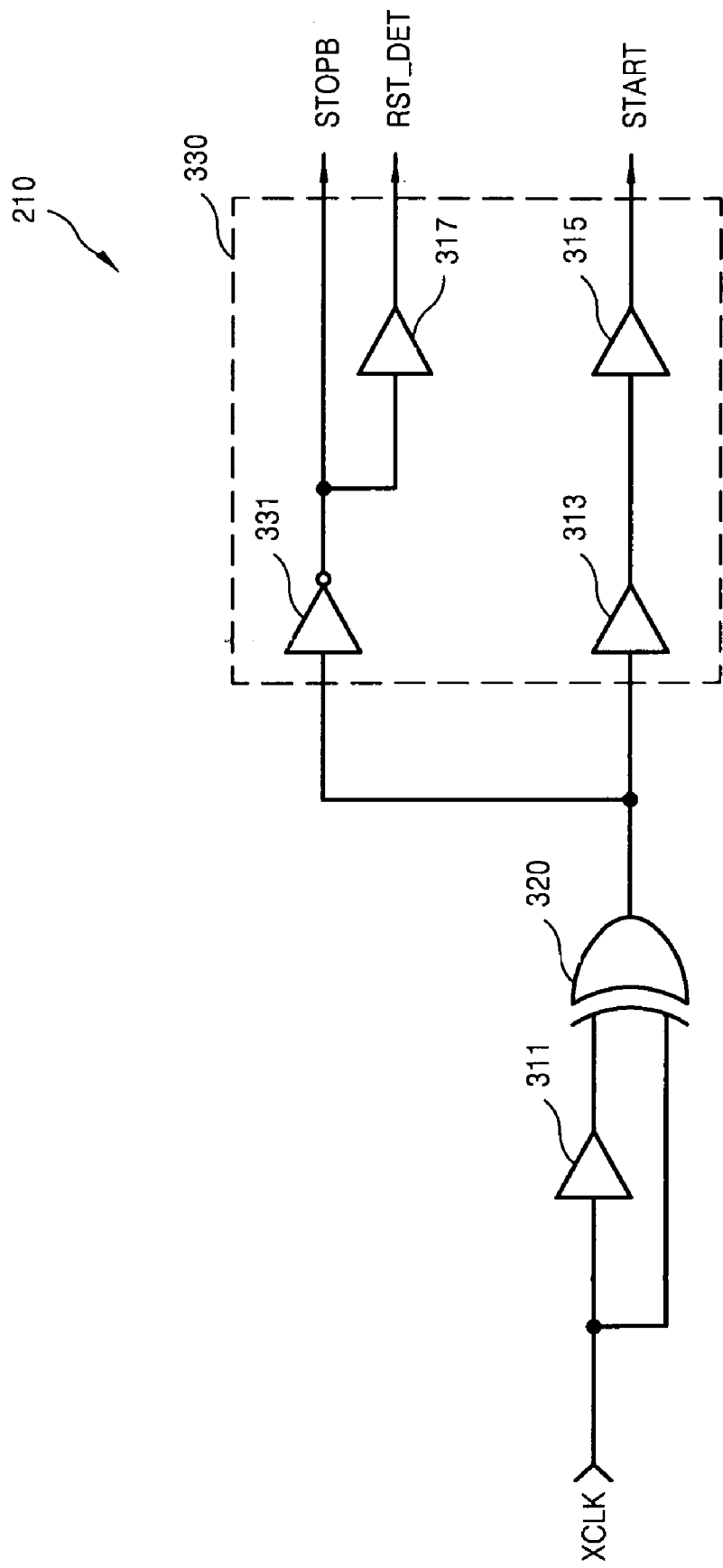
FIG. 3 is a detailed circuit diagram of an edge detecting circuit illustrated in FIG. 2.

FIG. 3 is a circuit diagram of the edge detecting circuit 210 illustrated in FIG. 2. Referring to FIG. 3, the edge detecting circuit 210 includes a delay unit 311, an XOR gate 320, and an edge detection signal generator 330. The edge detection signal generator 330 includes a plurality of delay units 313, 315, and 317 and an inverter 331.

Figure 4:
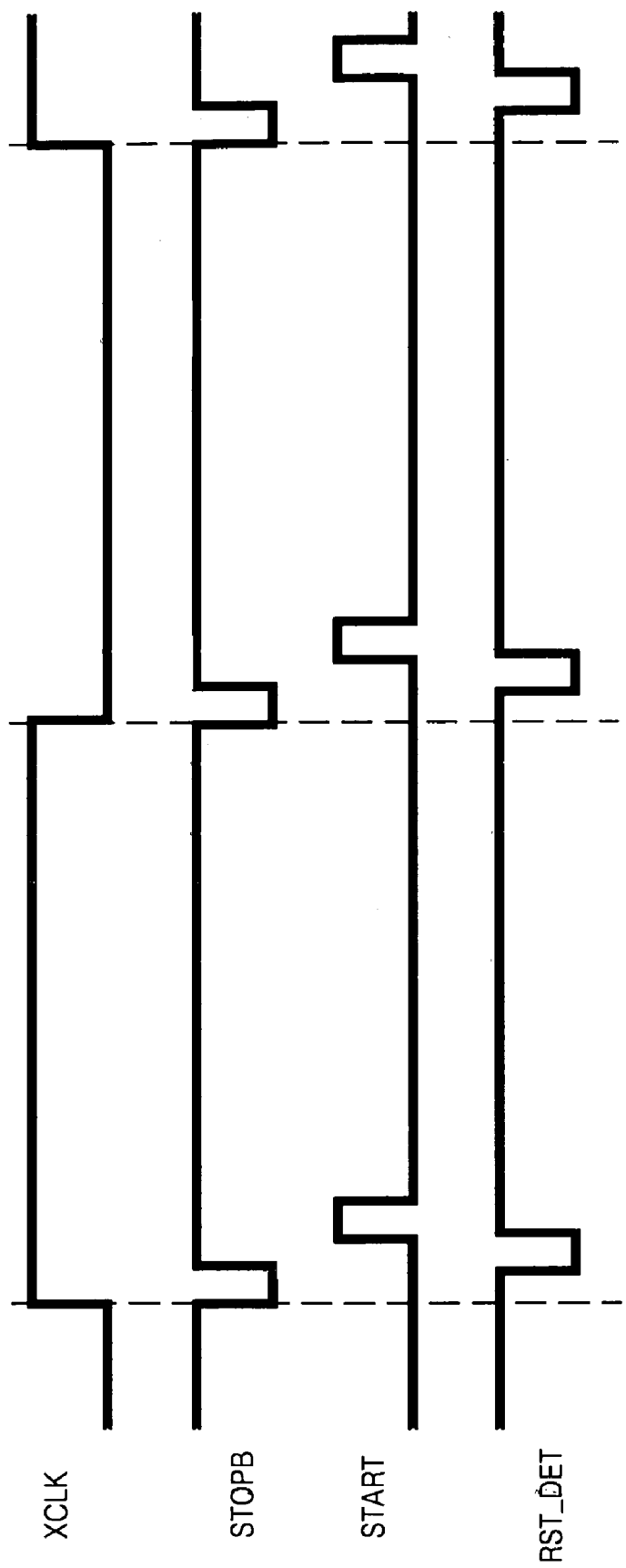
FIG. 4 is a signal timing chart illustrating the operation of the edge detecting circuit illustrated in FIG. 2.

FIG. 4 is a signal timing chart illustrating the operation of the edge detecting circuit 210 as shown in FIG. 3. The operation of the edge detecting circuit 210 will be described below with reference to FIGS. 3 and 4.

A clock signal XCLK is delayed by the delay unit 311 for a predetermined period of time. The XOR gate 320 performs an XOR operation on the clock signal XCLK and the delayed clock signal. The inverter 331 inverts an output signal of the XOR gate 320 to generate a stop bar signal STOPB. Accordingly, the stop bar signal STOPB is generated at every edge of the clock signal XCLK and is a periodical pulse signal with a pulse duration equal to the delay time of the delay unit 311, as illustrated in FIG. 4.

The delay units 313 and 315 delay the output signal of the XOR gate 320 to generate a start signal START. The delay unit 317 delays the stop bar signal STOPB to generate a reset detection signal RST_DET. Accordingly, the reset detection signal RST_DET has the same waveform as the stop bar signal STOPB but its phase lags that of the stop bar signal STOPB. The start signal START is obtained by delaying an inverted signal of the stop bar signal STOPB for a predetermined period of time. As a result, the stop bar signal STOPB, the start signal START, and the reset detection signal RST_DET are edge detection signals generated in response to each of the rising and falling edges of the clock signal XCLK.

The edge detecting circuit 210 may be enabled or disabled in response to an enable signal (not shown). In other words, only when the enable signal is activated, will the edge detecting circuit 210 operate normally.

The clock signal generating circuit 220 generates a selection clock signal SEL_CLK having a predetermined duty cycle and a predetermined period in response to the edge detection signals START and STOPB output from the edge detecting circuit 210. The clock signal generating circuit 220 generates the selection clock signal SEL_CLK at least one time in each period of the clock signal XCLK when a frequency of the clock signal XCLK is in a predetermined normal range.

Figure 5:
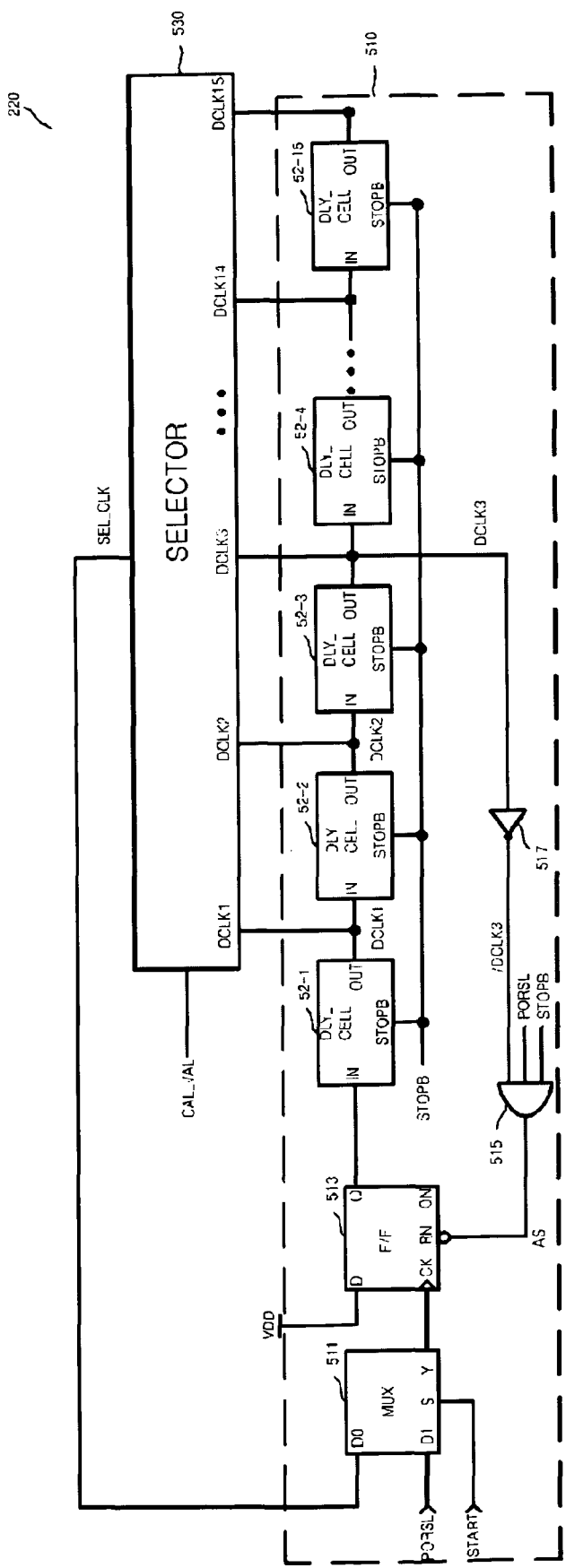
FIG. 5 is a detailed circuit diagram of a clock signal generating circuit illustrated in FIG. 2.
Figure 7:
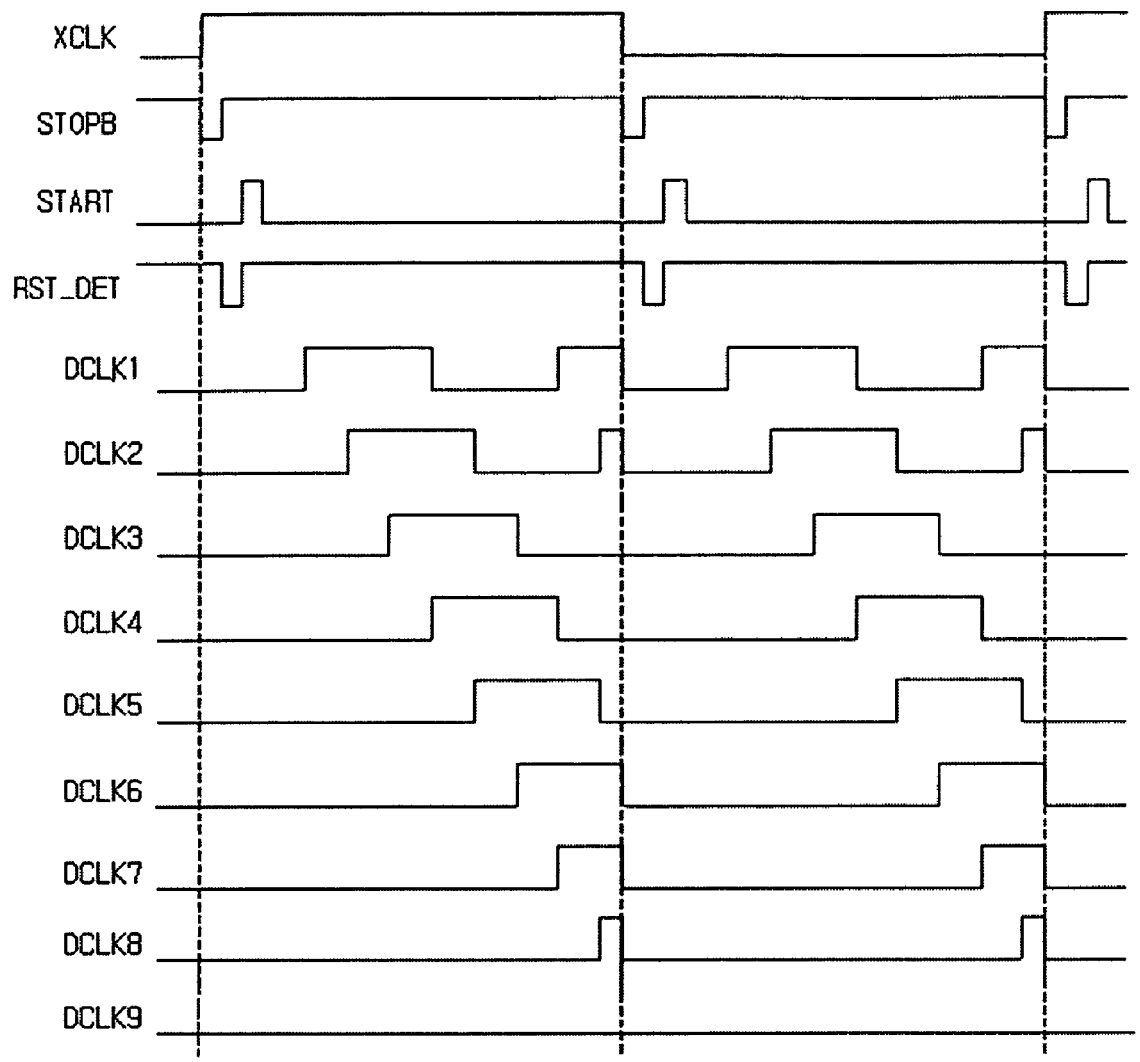
FIG. 7 is a signal timing chart illustrating the operation of the clock signal generating circuit illustrated in FIG. 2.

FIG. 5 is a detailed circuit diagram of the clock signal generating circuit 220 illustrated in FIG. 2. FIG. 7 is a signal timing chart illustrating the operation of the clock signal generating circuit 220. The clock signal generating circuit 220 includes a delay signal generator 510 and a selector 530.

The delay signal generator 510 generates a plurality of delayed clock signals DCLK1 through DCLK15, each of which may become the selection clock signal SEL_CLK. The selector 530 selects one from the plurality of delayed clock signals DCLK1 through DCLK15 to generate the selection clock signal SEL_CLK.

The delay signal generator 510 includes a multiplexer 511, a flip-flop 513, an AND gate 515, an inverter 517, and a plurality of delay cells 52-1 through 52-15 connected in series.

The multiplexer 511 selects and outputs either a power-on reset signal PORSL or the selection clock signal SEL_CLK in response to the start signal START fed thereto. The power-on reset signal PORSL is activated to a high level when a power supply voltage VDD is applied externally to the flip flop 513 and the selection clock signal SEL_CLK is output from the selector 530.

The flip-flop 513 has a clock terminal CK receiving an output signal of the multiplexer 511 and an input terminal connected to the power supply voltage VDD. Accordingly, the flip-flop 513 outputs a signal at a power supply voltage level, that is, a high level, in synchronization with the output signal of the multiplexer 511. The output signal of the flip-flop 513 is input to the first delay cell 52-1. The first delay cell 52-1 delays the output signal of the flip-flop 513 for a first delay time to output the first delayed clock signal DCLK1 and is reset in response to the stop bar signal STOPB fed to the AND gate 515. Accordingly, the first delayed clock signal DCLK1 is generated in response to the start signal START but transits to the high level after being delayed for a predetermined period of time from the start signal START, as illustrated in FIG. 7.

The flip-flop 513 is reset in response to an AND signal AS from the AND gate 515. The AND signal AS is a result of performing an AND operation on an inverted signal /DCLK3 of the third delayed clock signal DCLK3, the power-on reset signal PORSL, and the stop bar signal STOPB. Accordingly, when the third delayed clock signal DCLK3 transits to the high level, the AND signal AS transits to the low level and the flip-flop 513 is reset. When the flip-flop 513 is reset, an output signal Q of the flip-flop 513 is at the low level, and therefore, the first delayed clock signal DCLK1 is also at the low level. In other words, when the third delayed clock signal DCLK3 transits to the high level, the first delayed clock signal DCLK1 transits to the low level after about the first delay time. As a result, the high level period of the first delayed clock signal DCLK1 is determined.

Accordingly, the multiplexer 511 and the flip-flop 513 generate a basic clock signal, which transits to the high level in response to the start signal START and transits to the low level in response to a certain signal, that is, the third delayed clock signal DCLK3 in the exemplary embodiment, among the first through N-th delayed clock signals DCLK1 through DCLK15. The selection clock signal SEL_CLK is fed back to a first input terminal D0 of the multiplexer 511 so that the basic clock signal is continuously generated until the stop bar signal STOPB is generated.

The first through fifteenth delay cells 52-1 through 52-15 that are connected in series output signals by delaying the basic clock signal by "first delay time", "first delay time+second delay time", . . . , "first delay time+second delay time+ . . . +fifteenth delay time", respectively.

More specifically, the first delayed clock signal DCLK1 output from the first delay cell 52-1 is input to the second delay cell 52-2. The second delay cell 52-2 delays the received first delayed clock signal DCLK1 for the second delay time, thereby outputting the second delayed clock signal DCLK2, and is reset in response to the stop bar signal STOPB. Accordingly, the second delayed clock signal DCLK2 lags behind the first delayed clock signal DCLK1 by the second delay time.

The second delayed clock signal DCLK2 output from the second delay cell 52-2 is input to the third delay cell 52-3. Accordingly, the third delayed clock signal DCLK2 output from the third delay cell 52-3 lags behind the second delayed clock signal DCLK2 by the third delay time.

In this manner, each of the other delay cells 52-4 through 52-15 connected in series receives an output signal of a previous delay cell and outputs a delayed signal. The delay times of the respective first through fifteenth delay cells 52-1 through 52-15, that is, the first through fifteenth delay times, may be different from one another but may be the same. In the exemplary embodiment of the present invention, they are assumed to be the same.

The output signals of the respective first through fifteenth delay cells 52-1 through 52-15, that is, the first through fifteenth delayed clock signals DCLK1 through DCLK15, are input to the selector 530. Meanwhile, the third delayed clock signal DCLK3 is inverted and then input to the AND gate 515.

Figure 6:
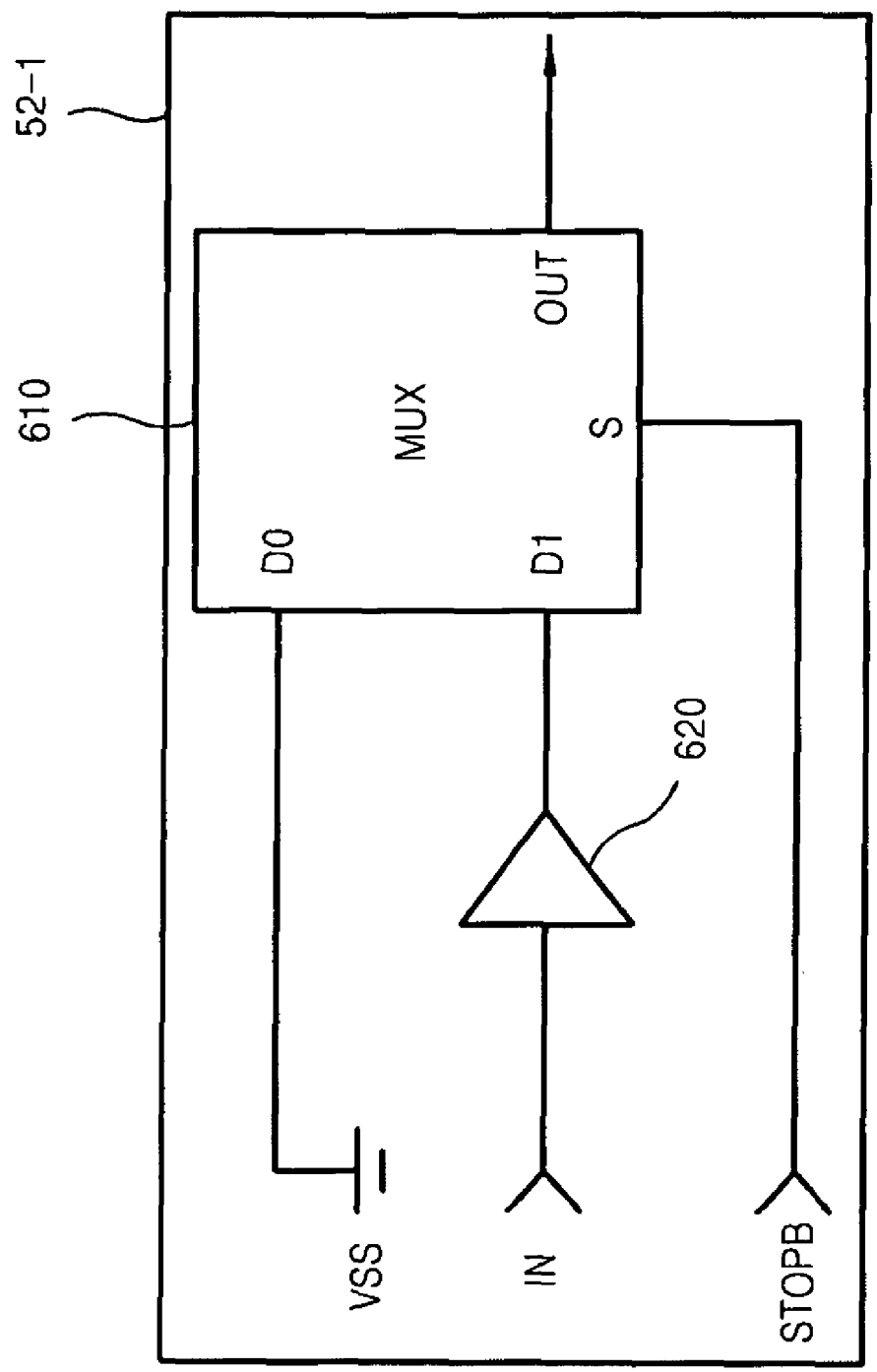
FIG. 6 is a detailed circuit diagram of a first delay cell illustrated in FIG. 5.

FIG. 6 is a detailed circuit diagram of the first delay cell 52-1. Referring to FIG. 6, the first delay cell 52-1 includes a multiplexer 610 and a delay element 620. The delay element 620 delays an input signal IN for the predetermined first delay time. The multiplexer 610 selects and outputs either an output signal of the delay element 620 or a ground voltage VSS in response to the stop bar signal STOPB fed thereto. Accordingly, the output signal of the first delay cell 52-1 has a waveform lagging that of the input signal IN by the first delay time and is reset to the low level in response to the stop bar signal STOPB.

The other delay cells 52-2 through 52-15 have the same structure as the first delay cell 52-1 illustrated in FIG. 6. Thus, a detailed description of the internal structures of the other delay cells 52-2 through 52-15 will be omitted.

The selector 530 is a decoder circuit which selects one signal from among the first through fifteenth delayed clock signals DCLK1 through DCLK15 and outputs the selected one as the selection clock signal SEL_CLK in response to a selection signal CAL_VAL.

The selection clock signal SEL_CLK is input to the determination circuit 230 shown in FIG. 2 and to the first input terminal D0 of the multiplexer 511 shown in FIG. 5. Since the selection clock signal SEL_CLK is fed back to the multiplexer 511, the first delayed clock signal DCLK1 that has transited to the low level in response to the third delayed clock signal DCLK3 transits to the high level. Thereafter, the first delayed clock signal DCLK1 transits again from the high level to the low level in response to the third delayed clock signal DCLK3. This operation is repeated until all of the delay cells 52-1 through 52-15 are reset in response to the stop bar signal STOPB. The first delayed clock signal DCLK1 is delayed and then output as the second delayed clock signal DCLK2 by the second delay cell 52-2 and the second delayed clock signal DCLK2 is delayed and then output as the third delayed clock signal DCLK3 by the third delay cell 52-3. The remaining fourth through fifteenth delayed clock signals DCLK4 through DCLK15 are generated based on the same principle as the second and third delayed clock signals DCLK2 and DCLK3 are generated.

Accordingly, as illustrated in FIG. 7, the first through fifteenth delayed clock signals DCLK1 through DCLK15 are sequentially generated in response to the start signal START and then reset in response to the stop bar signal STOPB. Thereafter, they are sequentially generated again in response to the start signal START and then reset in response to the stop bar signal STOPB. This operation is repeated.

Table 2 set forth below shows periods of time between a time when the start signal START is generated and times when the first through fifteenth delayed clock signals DCLK1 through DCLK15 are generated respectively.

TABLE 2

|  | Best conditions | Worst conditions |
| --- | --- | --- |
| DCLK1 | 10 ns | 20 ns |
| DCLK2 | 20 ns | 40 ns |
| DCLK3 | 30 ns | 60 ns |
| DCLK4 | 40 ns | 80 ns |
| DCLK5 | 50 ns | 100 ns |
| DCLK6 | 60 ns | 120 ns |
| DCLK7 | 70 ns | 140 ns |
| DCLK8 | 80 ns | 160 ns |
| DCLK9 | 90 ns | 180 ns |
| DCLK10 | 100 ns | 200 ns |
| DCLK11 | 110 ns | 220 ns |
| DCLK12 | 120 ns | 240 ns |
| DCLK13 | 130 ns | 260 ns |
| DCLK14 | 140 ns | 280 ns |
| DCLK15 | 150 ns | 300 ns |

Referring to Table 2, each of the first through fifteenth delay cells 52-1 through 52-15 has a delay time of 10 ns in the best conditions. Accordingly, when delay times in the multiplexer 511 and the flip-flop 513 are ignored, the first through fifteenth delayed clock signals DCLK1 through DCLK15 respectively transit to the high level 10, 20, 30, 40, 50, 60, 70, 80, 90, 100, 110, 120, 130, 140 and 150 ns after the start signal START is generated. The delay time of each delay cell, however, may be different according to various conditions, for example, due to manufacturing processes and temperature variations. Accordingly, the delay time under the worst conditions may be two times longer than that in the best conditions. In this case, the first through fifteenth delayed clock signals DCLK1 through DCLK15 respectively transit to the high level 20, 40, 60, 80, 100, 120, 140, 160, 180, 200, 220, 240, 260, 280 and 300 ns after the start signal START is generated. Since the delay time of each delay cell may be different, as described above, it is necessary to select an appropriate signal from among the first through fifteenth delayed clock signals DCLK1 through DCLK15 by controlling the selection signal CAL_VAL. The selection signal CAL_VAL is determined by the control circuit 240 shown in FIG. 2, which will be described in detail hereinbelow.

The determination circuit 230 shown in FIG. 2 generates a frequency detection signal FREQDET based on the number of occurrences of the selection clock signal SEL_CLK during a period of the clock signal XCLK. In other words, the determination circuit 230 detects whether a rising or falling edge occurs in the selection clock signal SEL_CLK during the period of the clock signal XCLK or detects the number of rising or falling edges occurring in the selection clock signal SEL_CLK during the period of the clock signal XCLK and generates the frequency detection signal FREQDET based on a detection result.

FIG. 8 is a block diagram of the determination circuit 230 illustrated in FIG. 2. Referring to FIG. 8, the determination circuit 230 includes a high frequency detector 810, a low frequency detector 820, and a detection signal generator 830.

The high frequency detector 810 internally generates a high frequency detection signal HIGH_DET_SIG, which is activated to a high level in response to the selection clock signal SEL_CLK and is reset in response to the reset detection signal RST_DET. The high frequency detector 810 detects a level of the high frequency detection signal HIGH_DET_SIG in response to the stop bar signal STOPB and generates a high frequency determination signal FREQ_HIGH. The high frequency detector 810 generates the high frequency determination signal FREQ_HIGH at a high level when the selection clock signal SEL_CLK is generated at least one time during a current period and generates the high frequency determination signal FREQ_HIGH at a low level when the selection clock signal SEL_CLK is not generated during the current period, that is, when the number of occurrences of the selection clock signal SEL_CLK is 0. Accordingly, the high frequency detector 810 generates the high frequency determination signal FREQ_HIGH at the high level only when the number of occurrences of the selection clock signal SEL_CLK during a period of the clock signal XCLK is at least a minimum reference value, which is one in this exemplary embodiment.

The low frequency detector 820 counts the number of occurrences of the selection clock signal SEL_CLK to obtain a count value and generates a low frequency determination signal FREQ_LOW at a low level when the count value reaches a maximum reference value. Accordingly, the low frequency detector 820 generates the low frequency determination signal FREQ_LOW at a high level when the number of occurrences of the selection clock signal SEL_CLK during a period of the clock signal XCLK is less than the maximum reference value. The count value is reset to 0 in response to the stop bar signal STOPB or the reset detection signal RST_DET.

The detection signal generator 830 receives the high frequency determination signal FREQ_HIGH and the low frequency determination signal FREQ_LOW and generates the frequency detection signal FREQDET based on the high and low frequency determination signals FREQ_HIGH and FREQ_LOW.

Figure 9A:
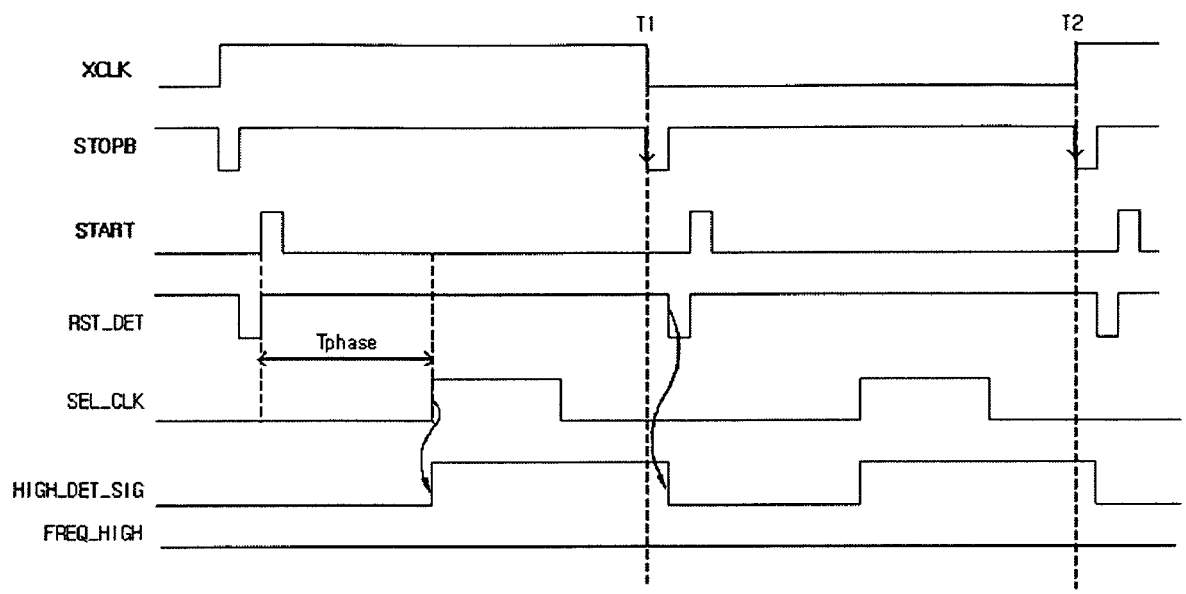
FIGS. 9A through 9C are signal timing charts illustrating the operation of the determination circuit illustrated in FIG. 2.
Figure 9B:
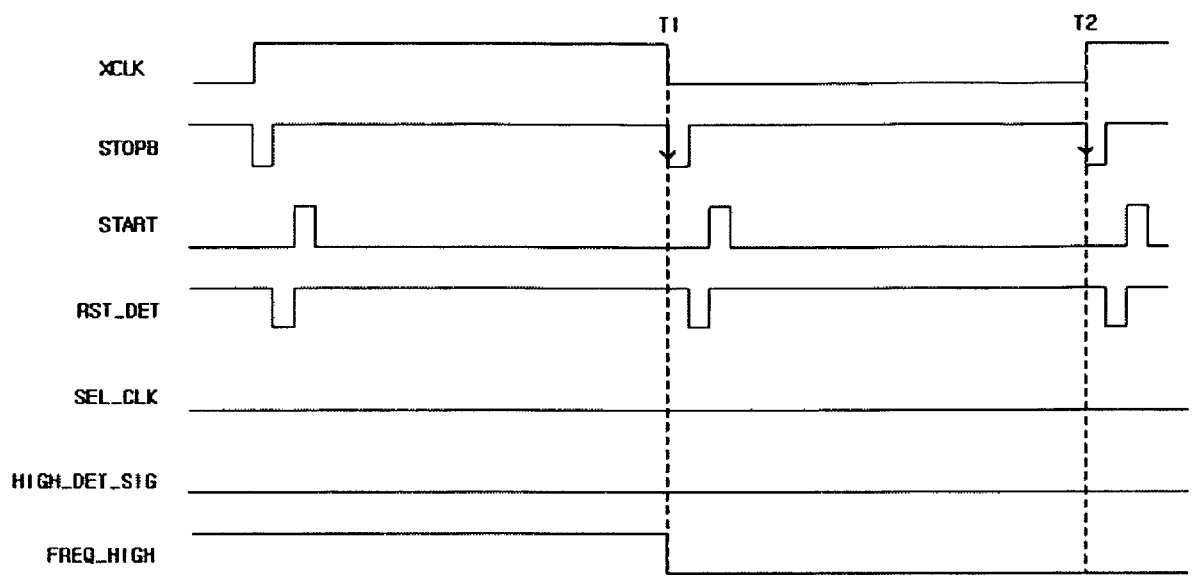
Figure 9C:
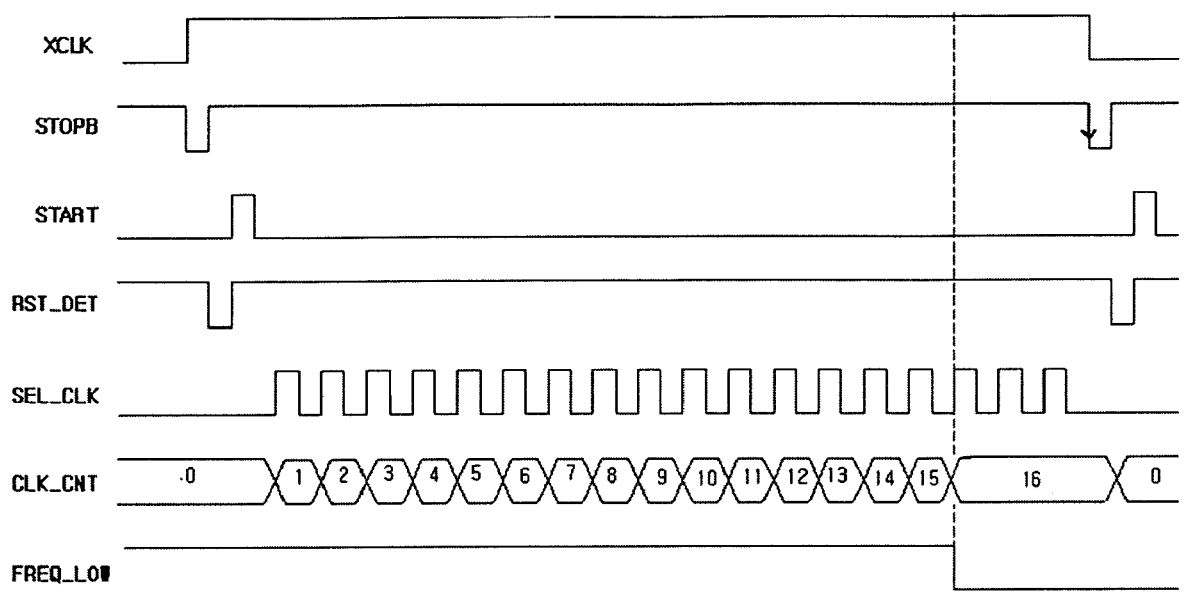

FIGS. 9A through 9C are signal timing charts illustrating the operation of the determination circuit 230. The clock signal XCLK, the start signal START, the stop bar signal STOPB, and the reset detection signal RST_DET illustrated in FIGS. 9A through 9C are the same as those illustrated in FIG. 4.

FIG. 9A illustrates the operation of the determination circuit 230 when an operating frequency is in a normal range. The high frequency detection signal HIGH_DET_SIG transits to a high level in response to the rising edge of the selection clock signal SEL_CLK. The high frequency detection signal HIGH_DET_SIG is reset in response to the reset detection signal RST_DET. The level of the high frequency determination signal FREQ_HIGH is determined based on the level of the high frequency detection signal HIGH_DET_SIG at each of the falling edges T1 and T2 of the stop bar signal STOPB. More specifically, when the high frequency detection signal HIGH_DET_SIG is at a low level at the falling edge T1 or T2 of the stop bar signal STOPB, the high frequency determination signal FREQ_HIGH transits from the high level to the low level.

When the operating frequency is in the normal range, at least one pulse of the selection clock signal SEL_CLK is generated during a half cycle, that is, a high level period or a low level period, of the clock signal XCLK. The selection signal CAL_VAL is set to generate the selection clock signal SEL_CLK at least one time during the half cycle of the clock signal XCLK even when the operating frequency is a highest frequency, that is, a high reference frequency, in the normal range, that is, when the half cycle of the clock signal XCLK is the shortest. For this operation, it is preferable that a delay time Tphase between the generation (the rising edge) of the start signal START and the generation (the rising edge) of the selection clock signal SEL_CLK is less than or equal to a half cycle of the high reference frequency. When considering a delay time between an edge of the clock signal XCLK and the generation (the rising edge) of the start signal START, it is preferable that the sum of a delay time between the edge of the clock signal XCLK and the generation of the start signal START and the delay time Tphase between the generation of the start signal START and the generation (the rising edge) of the selection clock signal SEL_CLK is less than or equal to the half cycle of the high reference frequency.

As described above, since the selection clock signal SEL_CLK is generated and transits to the high level before the stop bar signal STOPB is subsequently generated, the high frequency detection signal HIGH_DET_SIG also transits to the high level and remains in the high level before being reset in response to the reset detection signal RST_DET. Accordingly, as illustrated in FIG. 9A, the high frequency determination signal FREQ_HIGH is continuously maintained at the high level, which means that the operating frequency is in the normal range.

FIG. 9B illustrates the operation of the determination circuit 230 when the operating frequency is higher than the normal range. When an input frequency is higher than a frequency in the normal range, no rising edge occurs in the selection clock signal SEL_CLK during the half cycle, that is, the high or low level period, of the clock signal XCLK. Accordingly, the high frequency detection signal HIGH_DET_SIG is continuously maintained at the low level and, therefore, the high frequency determination signal FREQ_HIGH transits to the low level at the falling edge T1 of the stop bar signal STOPB.

FIG. 9C illustrates the operation of the determination circuit 230 when the operating frequency is lower than the normal range. Since the operating frequency is low, the half cycle of the clock signal XCLK is very long. Accordingly, the selection clock signal SEL_CLK having a cycle time less than the half cycle of the clock signal XCLK rises and falls repeatedly. Rising edges of the selection clock signal SEL_CLK are counted by a counter (not shown) within the low frequency detector 820 shown in FIG. 8. When a count value CLK_CNT reaches the maximum reference value, that is, 16 in this exemplary embodiment, the low frequency determination signal FREQ_LOW transits to the low level. The count value CLK_CNT is reset to 0 in response to the reset detection signal RST_DET.

The detection signal generator 830 shown in FIG. 8 generates the frequency detection signal FREQDET at the low level when at least one of the high frequency determination signal FREQ_HIGH and the low frequency determination signal FREQ_LOW is at the low level and generates the frequency detection signal FREQDET at the high level when both of the high and low frequency determination signals FREQ_HIGH and FREQ_LOW are at the high level. When the frequency detection signal FREQDET is at the low level, the operating frequency is not in the normal range. When the frequency detection signal FREQDET is at the high level, the operating frequency is in the normal range.

FIG. 10 is a block diagram of the control circuit 240 illustrated in FIG. 2. The control circuit 240 sets or changes the selection signal CAL_VAL for selecting one signal from among the plurality of the delayed clock signals DCLK1 through DCLK15 generated by the clock signal generating circuit 220.

Figure 11:
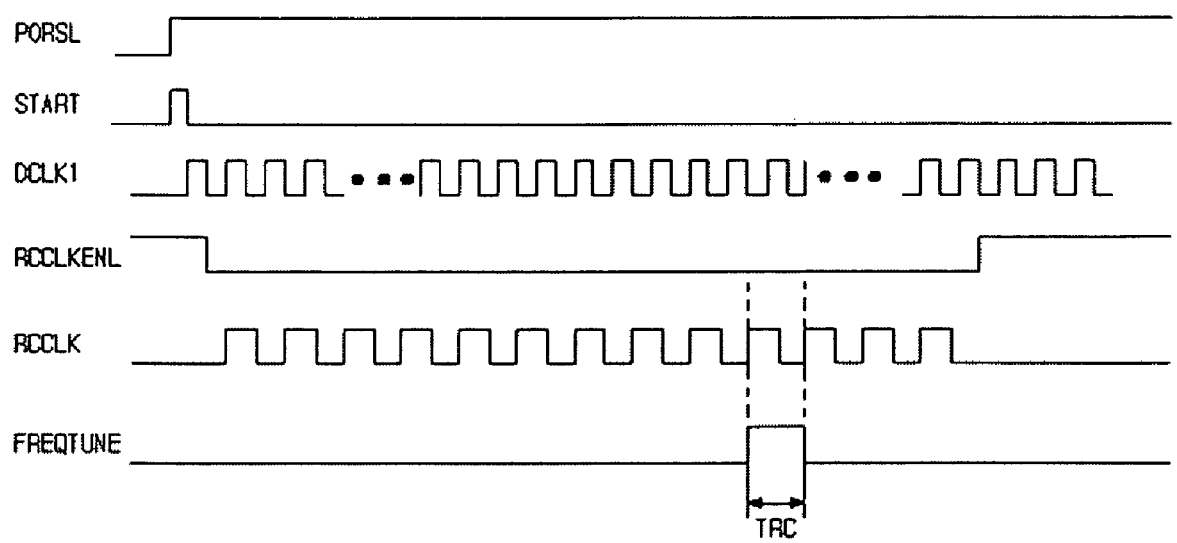
FIG. 11 is a signal timing chart illustrating the operation of the control circuit illustrated in FIG. 2.

FIG. 11 is a signal timing chart illustrating the operation of the control circuit 240. The operation of the control circuit 240 will be described with reference to FIGS. 10 and 11.

The control circuit 240 includes an oscillator enable element 1010, a comparator 1020, and an adjustor 1030. The oscillator enable element 1010 generates an RC oscillator enable signal RCCLKENL for enabling an RC oscillator 250 after the power-on reset signal PORSL is enabled to a high level. The RC oscillator enable signal RCCLKENL may be generated in response to the first delayed clock signal DCLK1 or the start signal START. The RC oscillator enable signal RCCLKENL is a low level enable signal. Accordingly, the RC oscillator 250 starts operation in response to a falling edge (or a low level) of the RC oscillator enable signal RCCLKENL and generates an oscillator clock signal RCCLK. A half cycle (or one cycle) of the oscillator clock signal RCCLK is rarely affected by environmental conditions or other system variations.

When the RC oscillator 250 is stabilized a predetermined period of time after it is enabled, the comparator 1020 generates a comparison signal FREQTUNE which is at the high level during only one clock cycle of the oscillator clock signal RCCLK. In other words, a high level period of the comparison signal FREQTUNE is equal to a cycle TRC of the oscillator clock signal RCCLK.

The comparator 1020 detects the number of delayed clock signals corresponding to the high level period of the comparison signal FREQTUNE among the first through fifteenth delayed clock signals DCLK1 through DCLK15. In detail, the comparator 1020 samples the comparison signal FREQTUNE using the first through fifteenth delayed clock signals DCLK1 through DCLK15 and transmits a sampling result signal to the adjustor 1030. In this example, it is assumed that the high level period TRC of the comparison signal FREQTUNE is 100 ns. In this case, when a value obtained by sampling the comparison signal FREQTUNE using the first through tenth delayed clock signals DCLK1 through DCLK10 is a high level and a value obtained by sampling the comparison signal FREQTUNE using the eleventh through fifteenth delayed clock signals DCLK11 through DCLK15 is a low level, the delay time of each of the delay cells 52-1 through 52-15 will be 10 ns. When the delay time of each delay cell and the high reference frequency, that is, the highest frequency in the normal range of the operating frequency, are known, the selection clock signal SEL_CLK can be selected.

The adjustor 1030 sets the selection signal CAL_VAL in response to the output signal of the comparator 1020. The adjustor 1030 sets the selection signal CAL_VAL considering the half cycle of the clock signal XCLK at the high reference frequency. For example, when a frequency higher than 5 MHz is not in the normal range, the high reference frequency is 5 MHz. When a duty cycle of the clock signal XCLK is 50% at the high reference frequency, the half cycle of the clock signal XCLK is 100 ns. In this case, the adjustor 1030 may set the selection signal CAL_VAL to output the tenth delayed clock signal DCLK10 as the selection clock signal SEL_CLK. Since the delay time of each delay cell is 10 ns, the tenth delayed clock signal DCLK10 is generated about 100 ns after the start signal START.

In a state where the high level period of the comparison signal FREQTUNE is 100 ns and the high reference frequency is 5 MHz, when a value obtained by sampling the comparison signal FREQTUNE using the first through fifth delayed clock signals DCLK1 through DCLK5 is a high level and a value obtained by sampling the comparison signal FREQTUNE using the sixth through fifteenth delayed clock signals DCLK6 through DCLK15 is a low level, the delay time of each delay cell will be 20 ns. In this case, the adjustor 1030 may set the selection signal CAL_VAL to output the fifth delayed clock signal DCLK5 as the selection clock signal SEL_CLK. It is advisable that the selection signal CAL_VAL is set considering delay times in other elements as well as the delay cells 52-1 through 52-15.

As described above, in an exemplary embodiment of the present invention, even if the delay time of each delay cell in the clock signal generating circuit 220 varies with environmental conditions, the delay time of the delay cell is estimated based on a cycle of the oscillator clock signal RCCLK output from the RC oscillator 250 and the selection signal CAL_VAL is set according to the delay time. As a result, a frequency can be accurately detected without being influenced by temperature or other environmental factors. A frequency detecting circuit according to an exemplary embodiment of the present invention can be used for semiconductor apparatuses, such as integrated circuit cards, for example, smart cards.

Figure 12:
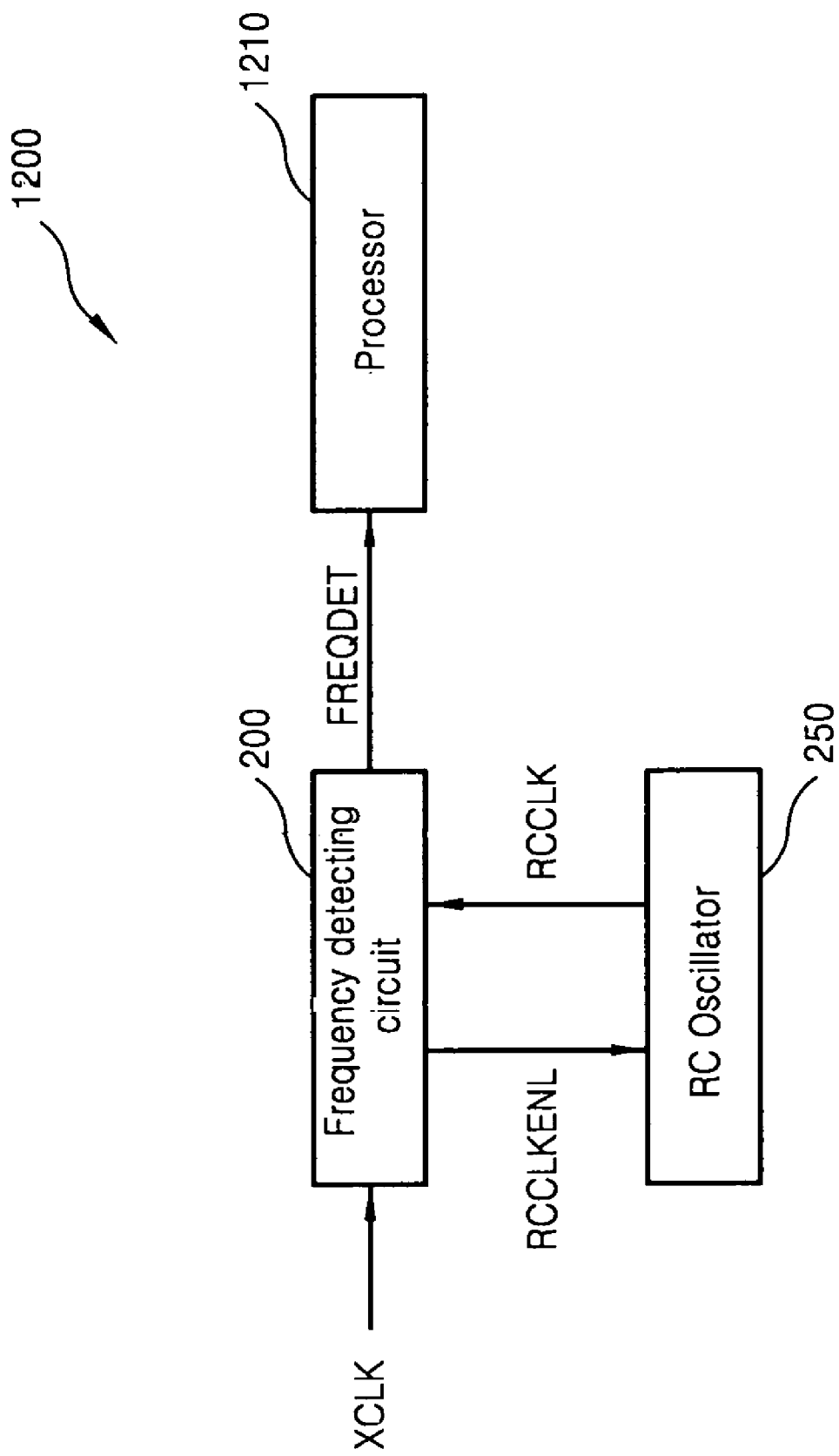
FIG. 12 is a schematic block diagram of a smart card including a frequency detecting circuit, according to an exemplary embodiment of the present invention.

FIG. 12 is a schematic block diagram of a smart card 1200 including the frequency detecting circuit 200 shown in FIG. 2, according to an exemplary embodiment of the present invention. The smart card 1200 includes the frequency detecting circuit 200, the internal oscillator, that is, RC oscillator 250, and a processor 1210 that performs processing operations (not shown) of the smart card.

As described above, the frequency detecting circuit 200 detects whether the frequency of the clock signal XCLK is in a normal range and generates the frequency detection signal FREQDET. In the above-described exemplary embodiment, the frequency detecting circuit 200 generates the frequency detection signal FREQDET at a high level when the frequency of the clock signal XCLK is in the normal range and generates the frequency detection signal FREQDET at a low level otherwise.

The processor 1210 is reset in response to the frequency detection signal FREQDET at the low level.

The RC oscillator 250 starts an operation in response to the RC oscillator enable signal RCCLKENL and generates the oscillator clock signal RCCLK. Generally, smart cards have an embedded oscillator. The oscillator clock signal RCCLK is used to set the selection signal CAL_VAL for determining the selection clock signal SEL_CLK. The selection signal CAL_VAL may be set or changed not to affect the operation of the smart card 1200.

Figure 13:
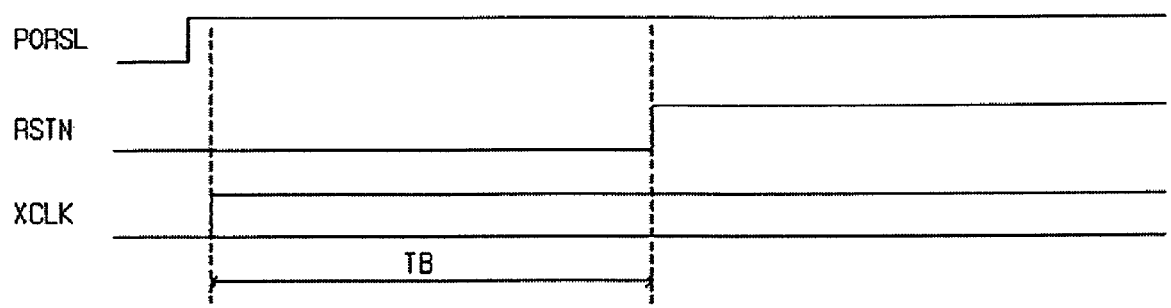
FIG. 13 is a timing chart illustrating the operation of a conventional smart card.

FIG. 13 is a timing chart illustrating the operation of a conventional smart card. Referring to FIG. 13, the clock signal XCLK is input a predetermined period of time after the power-on reset signal PORSL is enabled to a high level when power is applied. Reset is released when the reset signal RSTN transits to the high level after a predetermined time TB since the input of the clock signal XCLK. The predetermined time TB is at least a 400-clock cycle time. Accordingly, in a normal state, there is sufficient time until the reset signal RSTN is enabled since the power-on reset signal PORSL is enabled by the input of power. Thus, during the predetermined time TB, it is preferable that the control circuit 240 included in the frequency detecting circuit 200 enables the RC oscillator 250 and sets the selection signal CAL_VAL using the oscillator clock signal RCCLK. In addition, the control circuit 240 may adjust the selection signal CAL_VAL by enabling the RC oscillator 250 with a predetermined period.

As described above, according to exemplary embodiments of the present invention, since the frequency of a clock signal is detected every half period, that is, every high/low level period, of the clock signal, the reliability and the accuracy of frequency detection is improved. In particular, even if the high level period is different from the low level period in the clock signal, the frequency can be accurately detected. In addition, since the frequency is detected in a digital manner, chip area and power consumption are reduced as compared to a conventional analog manner.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A frequency detecting circuit comprising:
   an edge detecting circuit detecting an edge of a clock signal and generating an edge detection signal; and
   a clock signal generating circuit generating a selection clock signal in response to the edge detection signal; and
   a determination circuit determining whether a frequency of the clock signal is in a predetermined normal range based on a number of occurrences of the selection clock signal during a period of the clock signal,
   wherein the clock signal generating circuit generates the selection clock signal at least one time during the period of the clock signal when the frequency of the clock signal is in the predetermined normal range, and the period of the clock signal is between adjacent edges of the clock signal.

2. The frequency detecting circuit of claim 1, wherein the determination circuit generates a frequency detection signal at a first logic level when the number of occurrences of the selection clock signal is greater than or equal to a first reference value and less than a second reference value and generates the frequency detection signal at a second logic level when the number of occurrences of the selection clock signal is less than the first reference value or is greater than or equal to the second reference value.

3. The frequency detecting circuit of claim 2, wherein the edge detecting circuit comprises:
   a delay unit delaying the clock signal for a predetermined period of time to generate a delayed signal;
   an XOR gate performing an XOR operation on the delayed signal output from the delay unit and the clock signal; and
   an edge detection signal generator generating a first edge detection signal and a second edge detection signal using an output signal of the XOR gate.

4. The frequency detecting circuit of claim 3, wherein the determination circuit comprises:
   a high frequency detector generating a high frequency detection signal in response to the selection clock signal, detecting a level of the high frequency detection signal in response to the second edge detection signal, and generating a high frequency determination signal based on the level of the high frequency detection signal; and a low frequency detector counting the number of occurrences of the selection clock signal and generating a low frequency determination signal based on a count value obtained as a result of the counting.

5. The frequency detecting circuit of claim 3, wherein the clock signal generating circuit comprises:
a signal generator generating first through N-th delayed clock signals in response to the first edge detection signal where N is 2 or a natural number greater than 2; and
a selector selecting one signal from among the first through N-th delayed clock signals in response to a selection signal and outputting the selected signal as the selection clock signal, and
the first through N-th delayed clock signals are reset in response to the second edge detection signal.

6. The frequency detecting circuit of claim 5, wherein the signal generator comprises:
a basic clock signal generator generating a basic clock signal which transits to the first logic level in response to the first edge detection signal and transits to the second logic level in response to one among the first through N-th delayed clock signals; and
N delay cells connected in series, the N delay cells each delaying the clock signal for a predetermined delay time and being reset in response to the second edge detection signal.

7. The frequency detecting circuit of claim 6, wherein the basic clock signal generator generates the basic clock signal in response to the selection clock signal.

8. The frequency detecting circuit of claim 5, further comprising a control circuit generating the selection signal using an oscillator clock signal.

9. The frequency detecting circuit of claim 8, wherein the control circuit comprises:
an oscillator enable element generating an oscillator enable signal for enabling an oscillator;
a comparator comparing a single cycle of the oscillator clock signal received from the oscillator with each of the first through N-th delayed clock signals; and
an adjustor generating the selection signal based on a result of the comparison.

10. The frequency detecting circuit of claim 9, wherein the oscillator is an RC oscillator.

11. A frequency detecting circuit comprising:
an edge detecting circuit detecting an edge of a clock signal;
a clock signal generating circuit generating a selection clock signal in response to the detected edge; and
a determination circuit detecting a frequency of the clock signal based on the number of occurrences of the selection clock signal in a period of the clock signal;
wherein the edge detecting circuit generates a first edge detection signal and a second edge detection signal in response to the edge of the clock signal,
wherein the selection clock signal is generated a predetermined delay time after the first edge detection signal is generated and is reset in response to the second edge detection signal.

12. The frequency detecting circuit of claim 11, wherein the predetermined delay time is less than or equal to a half cycle of a predetermined high reference frequency, and the predetermined high reference frequency is a highest frequency in a predetermined frequency range.

13. The frequency detecting circuit of claim 11, wherein the clock signal generating circuit comprises:
a plurality of digital delay cells connected in series; and
a selector selecting one signal from among output signals of the plurality of digital delay cells in response to a selection signal and outputting the selected signal as a delayed clock signal.

14. The frequency detecting circuit of claim 13, further comprising a control circuit comparing a single cycle of an oscillator clock signal with each of the output signals of the plurality of digital delay cells and setting the selection signal.

15. The frequency detecting circuit of claim 11, wherein the determination circuit counts rising or falling edges of the selection clock signal and determines that the frequency of the clock signal is higher than a predetermined range when a count value obtained as a result of the counting is less than a first reference value and determines that the frequency of the clock signal is lower than the predetermined range when the count value is greater than or equal to a second reference value.

16. A semiconductor apparatus comprising:
a frequency detecting circuit detecting a frequency of a clock signal and generating a frequency detection signal; and
a processor controlling an operation of the semiconductor apparatus in response to the frequency detection signal,
wherein the frequency detecting circuit includes:
an edge detecting circuit detecting an edge of a clock signal and generating a first edge detection signal and a second edge detection signal in response to the detected edge of the clock signal;
a clock signal generating circuit generating a selection clock signal in response to the first edge detection signal and the second edge detection signal; and
a determination circuit detecting a frequency of the clock signal based on the number of occurrences of the selection clock signal in a period of the clock signal,
wherein the selection clock signal is generated a predetermined delay time after the first edge detection signal is generated and is reset in response to the second edge detection signal.

17. The semiconductor apparatus of claim 16, wherein the semiconductor apparatus is an integrated circuit card.

18. The semiconductor apparatus of claim 16, wherein the processor is reset in response to the frequency detection signal at a second logic level.

19. The semiconductor apparatus of claim 16, wherein the predetermined delay time is less than or equal to a half cycle of a predetermined high reference frequency, and the predetermined high reference frequency is a highest frequency in a predetermined frequency range.

20. The semiconductor apparatus of claim 19, wherein the clock signal generating circuit comprises:
a plurality of digital delay cells connected in series; and
a selector selecting one signal from among output signals of the plurality of digital delay cells in response to a selection signal and outputting the selected signal as a delayed clock signal.

21. The semiconductor apparatus of claim 20, further comprising an internal oscillator, wherein the frequency detecting circuit further includes a control circuit comparing a single cycle of an output clock signal of the internal oscillator with each of the output signals of the plurality of digital delay cells and setting the selection signal.

22. The semiconductor apparatus of claim 21, wherein the control circuit enables the internal oscillator within a predetermined initial period of time after the clock signal is externally applied to the frequency detecting circuit to set the selection signal.

23. A method of detecting a frequency, comprising:
    detecting an edge of a clock signal and generating a first edge detection signal and a second edge detection signal in response to the detected edge of the clock signal;
    generating a selection clock signal in response to the first edge detection signal and the second edge detection signal; and
    detecting a frequency of the clock signal based on a number of occurrences of the selection clock signal during a period between adjacent edges of the clock signal, wherein the selection clock signal is generated a predetermined delay time after the first edge detection signal is generated and is reset in response to the second edge detection signal.

24. The method of claim 23, wherein
    the generating of the selection clock signal comprises generating a plurality of delayed clock signals using a plurality of digital delay cells connected in series, selecting one signal from among the plurality of delayed clock signals in response to the selection signal, and outputting the selected signal as the selection clock signal.

25. The method of claim 24, further comprising comparing a single cycle of an oscillator clock signal with each of the delayed clock signals and setting the selection signal.

* * * * *